US010109448B2

United States Patent
Bolden et al.

(10) Patent No.: US 10,109,448 B2
(45) Date of Patent: *Oct. 23, 2018

(54) MULTIPLE-ELECTRODE PLASMA PROCESSING SYSTEMS WITH CONFINED PROCESS CHAMBERS AND INTERIOR-BUSSED ELECTRICAL CONNECTIONS WITH THE ELECTRODES

(71) Applicant: Nordson Corporation, Westlake, OH (US)

(72) Inventors: Thomas V. Bolden, Fremont, CA (US); Louis Fierro, Clearwater, FL (US); James D. Getty, Vacaville, CA (US)

(73) Assignee: NORDSON CORPORATION, Westlake, OH (US)

( * ) Notice: Subject to any disclaimer, the term of this patent is extended or adjusted under 35 U.S.C. 154(b) by 870 days.

This patent is subject to a terminal disclaimer.

(21) Appl. No.: 13/764,420

(22) Filed: Feb. 11, 2013

(65) Prior Publication Data
US 2013/0139967 A1 Jun. 6, 2013

Related U.S. Application Data

(63) Continuation of application No. 12/123,954, filed on May 20, 2008, now Pat. No. 8,372,238.

(51) Int. Cl.
*H01J 15/02* (2006.01)
*H01J 37/32* (2006.01)

(52) U.S. Cl.
CPC .......... *H01J 15/02* (2013.01); *H01J 37/3244* (2013.01); *H01J 37/32449* (2013.01); *H01J 37/32568* (2013.01); *H01J 37/32577* (2013.01)

(58) Field of Classification Search
CPC .. H01J 15/02; H01J 37/3244; H01J 37/32449; H01J 37/32577; H01J 37/32568
(Continued)

(56) References Cited

U.S. PATENT DOCUMENTS 4,223,048 A 9/1980 Engle
4,264,393 A * 4/1981 Gorin ..................... C23C 16/509
118/620

(Continued)

FOREIGN PATENT DOCUMENTS

CN 1327486 A 12/2001
CN 1783431 A 6/2006
(Continued)

OTHER PUBLICATIONS

Taiwan Intellectual Property Office, Office Action in Application No. 098116408, dated May 28, 2015.
(Continued)

*Primary Examiner* — Rudy Zervigon
(74) *Attorney, Agent, or Firm* — Baker & Hostetler LLP

(57) ABSTRACT

Apparatus for treating products with plasma generated from a source gas. The apparatus includes a vacuum chamber, a plurality of juxtaposed electrodes arranged in adjacent pairs inside the vacuum chamber, and a plasma excitation source electrically coupled with the electrodes. The apparatus may include conductive members extending into the interior of each electrode to establish a respective electrical connection with the plasma excitation source. The apparatus may include a gas distribution manifold and multiple gas delivery tubes coupled with the gas distribution manifold. Each gas delivery tube has an injection port configured to inject the source gas between each adjacent pair of electrodes. The apparatus may further include flow restricting members that operate to partially obstruct a peripheral gap between each adjacent pair of electrodes, which restricts the escape of the source gas from the process chamber between each adjacent pair of electrodes.

20 Claims, 10 Drawing Sheets

(58) Field of Classification Search
USPC .................................. 118/723 E; 156/345.43
See application file for complete search history.

(56) References Cited

U.S. PATENT DOCUMENTS

| | | | |
|---|---|---|---|
| 4,282,077 A | 8/1981 | Reavill | |
| 4,328,081 A | 5/1982 | Fazlin | |
| 4,425,210 A | 1/1984 | Fazlin | |
| 4,474,659 A | 10/1984 | Fazlin | |
| 4,623,441 A | 11/1986 | Fazlin | |
| 4,681,649 A | 7/1987 | Fazlin | |
| 4,689,105 A | 8/1987 | Fazlin | |
| 4,780,174 A * | 10/1988 | Lan | C30B 25/12 117/101 |
| 4,806,225 A | 2/1989 | Fazlin | |
| 4,859,271 A | 8/1989 | Fazlin | |
| 4,863,577 A | 9/1989 | Fazlin | |
| 5,280,156 A | 1/1994 | Niori et al. | |
| 5,424,396 A | 6/1995 | Tomita et al. | |
| 5,653,810 A * | 8/1997 | Kataoka | C23C 16/04 118/723 E |
| 5,795,452 A | 8/1998 | Kinoshita et al. | |
| 6,009,890 A | 1/2000 | Kaneko et al. | |
| 6,079,358 A * | 6/2000 | Kim | C23C 16/45563 118/723 E |
| 6,321,680 B2 | 11/2001 | Cook et al. | |
| 7,013,834 B2 | 3/2006 | Tyler et al. | |
| 8,333,166 B2 * | 12/2012 | Bolden, II | H01J 37/32082 118/723 E |
| 8,372,238 B2 * | 2/2013 | Bolden, II | H01J 37/3244 118/723 MP |
| 2001/0021422 A1 | 9/2001 | Yamakoshi et al. | |
| 2003/0048591 A1 | 3/2003 | Jann et al. | |
| 2003/0184234 A1 | 10/2003 | Hsu et al. | |
| 2006/0163201 A1 * | 7/2006 | Getty | H01J 37/32009 216/67 |
| 2006/0191480 A1 * | 8/2006 | Kishimoto | H01J 37/3244 118/723 E |
| 2008/0296261 A1 | 12/2008 | Zhao et al. | |
| 2015/0228461 A1 * | 8/2015 | Fukazawa | H01J 37/32091 216/71 |

FOREIGN PATENT DOCUMENTS

| | | | |
|---|---|---|---|
| CN | 1874545 A | 12/2006 | |
| CN | 1875454 A | 12/2006 | |
| DE | 156715 A | 9/1982 | |
| EP | 0359567 A2 | 3/1990 | |
| JP | 60123032 A | 7/1985 | |
| JP | 63247373 A | 10/1988 | |
| JP | 05148295 A | 6/1993 | |
| JP | 05283343 A | 10/1993 | |
| JP | 08148295 A | 6/1996 | |
| JP | 009213636 A | 8/1997 | |
| JP | 2002531695 A | 9/2002 | |
| JP | 2007514275 A | 5/2007 | |
| JP | 2008019470 A | 1/2008 | |
| TW | 507256 B | 10/2002 | |

OTHER PUBLICATIONS

Japan Patent Office, Official Action issued in Japanese patent application No. 2009-121573 dated Nov. 18, 2013.
European Patent Office, International Search Report in Corresponding PCT/US2004/032973, dated Dec. 15, 2005 (18 pages).
The International Bureau of WIPO, International Preliminary Report on Patentability in Corresponding PCT/US2004/032973, dated May 1, 2006 (11 pages).
Fierro et al, "Substrate Holder for Use in a Plasma Processing System and Plasma Processing Systems Incorporating the Substrate Holder", U.S. Appl. No. 60/952,957, filed Jul. 31, 2007.
US Patent and Trademark Office, Office Action issued in related U.S. Appl. No. 11/278,483 dated Jul. 17, 2008 (11 pages).
March, A Nordson Company, "PROVIA Plasma System", product brochure 2007 (2 pages).
March, A Nordson Company, "PCB Series Plasma Treatment System" product brochure 2004 (2 pages).
US Patent and Trademark Office, Office Action issued in related U.S. Appl. No. 11/278,483, dated Jan. 2, 2009.
The State Intellectual property Office of the People's Republic of China, First Office Action received in related Chinese Patent Application No. 200910141105.8 dated Jul. 3, 2012.
Korean Patent Application No. 10-2009-0043379, Notice of Preliminary Rejection dated Oct. 5, 2015, 2 pages (English Translation).
Taiwan Intellectual Property Office, Official Action issued in application No. 098116408 dated Sep. 6, 2014.
Japanese Application No. 2015-045390: Notice of Allowance dated Dec. 21, 2016.

* cited by examiner

MULTIPLE-ELECTRODE PLASMA PROCESSING SYSTEMS WITH CONFINED PROCESS CHAMBERS AND INTERIOR-BUSSED ELECTRICAL CONNECTIONS WITH THE ELECTRODES

CROSS-REFERENCE TO RELATED APPLICATIONS

This application is a continuation of application Ser. No. 12/123,954, filed May 20, 2008, which is hereby incorporated by reference herein in its entirety.

TECHNICAL FIELD

The invention relates generally to plasma processing and, in particular, to plasma treatment systems and methods for treating substrates with enhanced uniformity.

BACKGROUND

Plasma treatment is frequently used to modify the surface properties of substrates used in a diversity of applications including, but not limited to, integrated circuits, electronic packages, and printed circuit boards. In particular, plasma treatment may be used in electronics packaging, for example, to etch resin, to remove drill smear, to increase surface activation and/or surface cleanliness for eliminating delamination and bond failures, to improve wire bond strength, to ensure void free underfilling of chips attached to printed circuit boards, to removing oxides from surfaces, to enhance die attach, and to improve adhesion for chip encapsulation.

In a conventional plasma processing system, multiple substrates are placed inside a vacuum chamber, the vacuum chamber is evacuated and filled with a partial pressure of a source gas, a plasma consisting of a partially ionized source gas is generated inside the vacuum chamber, and a surface of each substrate is exposed to the plasma species. The outermost surface layer(s) of atoms are removed from each substrate by physical sputtering, chemically-assisted sputtering, and chemical reactions promoted by the plasma. The physical or chemical action may be used to condition the surface to improve properties such as adhesion, to selectively remove an extraneous surface layer, or to clean undesired contaminants from the substrate's surface.

In multiple electrode plasma processing systems, both sides of multiple panels of material are simultaneously plasma treated in a batch process. A substrate holder holds each panel with a vertical orientation between a pair of planar vertical electrodes, which are energized with a suitable atmosphere present in the treatment chamber of the treatment system to generate the plasma. The environment between each planar vertical electrode and the adjacent surface of the panel supplies a local process chamber in which the partially ionized source gas is present.

Plasma processing may be used during the manufacture of printed circuit boards to process the panels during various stages of fabrication. In one application, plasma is used to remove drill smear having the form of residual polymer resin that is spread along the walls of throughholes and vias by a mechanical drilling process. If left unmitigated, the drill smear may interfere with the plating process, such as electroless copper plating, used to form the metallization that establishes the electrical connections of the printed circuit board. Plasma may also be used to activate the surfaces of polymers used in the printed circuit boards to increase the wettability and lamination of plated metallization applied to the walls of throughholes and vias. Plasma may also be employed to remove photoresist residue when patterning fine pitch metallization lines on printed circuit boards and to prepare the inner layer of flex materials, such as polyimides, for metallization. Plasma may also be used to remove carbon residue resulting when the printed circuit board is laser drilled to form blind vias.

The panels that are plasma processed using multiple electrode plasma processing systems may be quite large. For example, the panels may have a rectangular perimeter that is characterized by a width of about 26 inches and a length of about 32 inches. Process uniformity across the entire surface area of each board achieved by conventional processing systems, while adequate for their intended purpose, may be insufficient as technological advances increase the density of the interconnects on the printed circuit board. Another challenge is to uniformly treat the panel in each of the different process chambers While conventional plasma processing systems have been adequate for their intended purpose, there is a need for a plasma processing system that is capable of improving the uniformity of the processing over the entire surface area of each printed circuit board and among multiple printed circuit boards processed in any single processed lot of boards.

SUMMARY

In one embodiment, an apparatus is provided for treating products with plasma generated from a source gas. The apparatus includes a vacuum chamber with an evacuable space, a pump port communicating with the evacuable space, and at least one gas port configured for introducing a source gas into the evacuable space. A plurality of electrodes is located in the evacuable space. The electrodes have a juxtaposed arrangement to define a plurality of process chambers in the evacuable space. Each of the electrodes includes an outer perimeter. A plasma excitation source is configured to power the electrodes so as to generate the plasma from the source gas in each of the process chambers. The apparatus further includes a plurality of conductive members. Each of the conductive members electrically couples a respective one of the electrodes with the plasma excitation source. Each of the conductive members is electrically connected with the respective one of the electrodes at a location inside the outer perimeter.

In another embodiment, an apparatus is provided for treating products with plasma generated from a source gas. The apparatus includes a vacuum chamber with an evacuable space and a pump port communicating with the evacuable space. A plurality of electrodes are located in the evacuable space with a juxtaposed arrangement in a plurality of adjacent pairs to define a plurality of process chambers in the evacuable space. Each of the adjacent pairs of the electrodes is separated by a gap to define a respective one of the process chambers. Each of the electrodes including an outer perimeter. A plurality of gas delivery tubes are disposed inside the vacuum chamber. Each of the gas delivery tubes includes an injection port configured to inject the source gas into a respective one of the process chambers inside the outer perimeter of the electrodes. A plasma excitation source is electrically coupled with the electrodes. The plasma excitation source is configured to power the electrodes so as to generate the plasma from the source gas in each of the process chambers. The apparatus further includes a plurality of flow restricting members. Each of the flow restricting members located in the gap between a respective one of the adjacent pairs of the electrodes. Each of the flow restricting members operates to reduce the gap for constraining a flow of the source gas out of each of the process chambers to the pump port.

In an alternative embodiment, the apparatus may further include a plurality of conductive members in addition to the gas delivery tubes and flow restricting members. Each of the conductive members electrically couples a respective one of the electrodes with the plasma excitation source. Each of the conductive members is electrically connected with the respective one of the electrodes at a location inside the outer perimeter.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
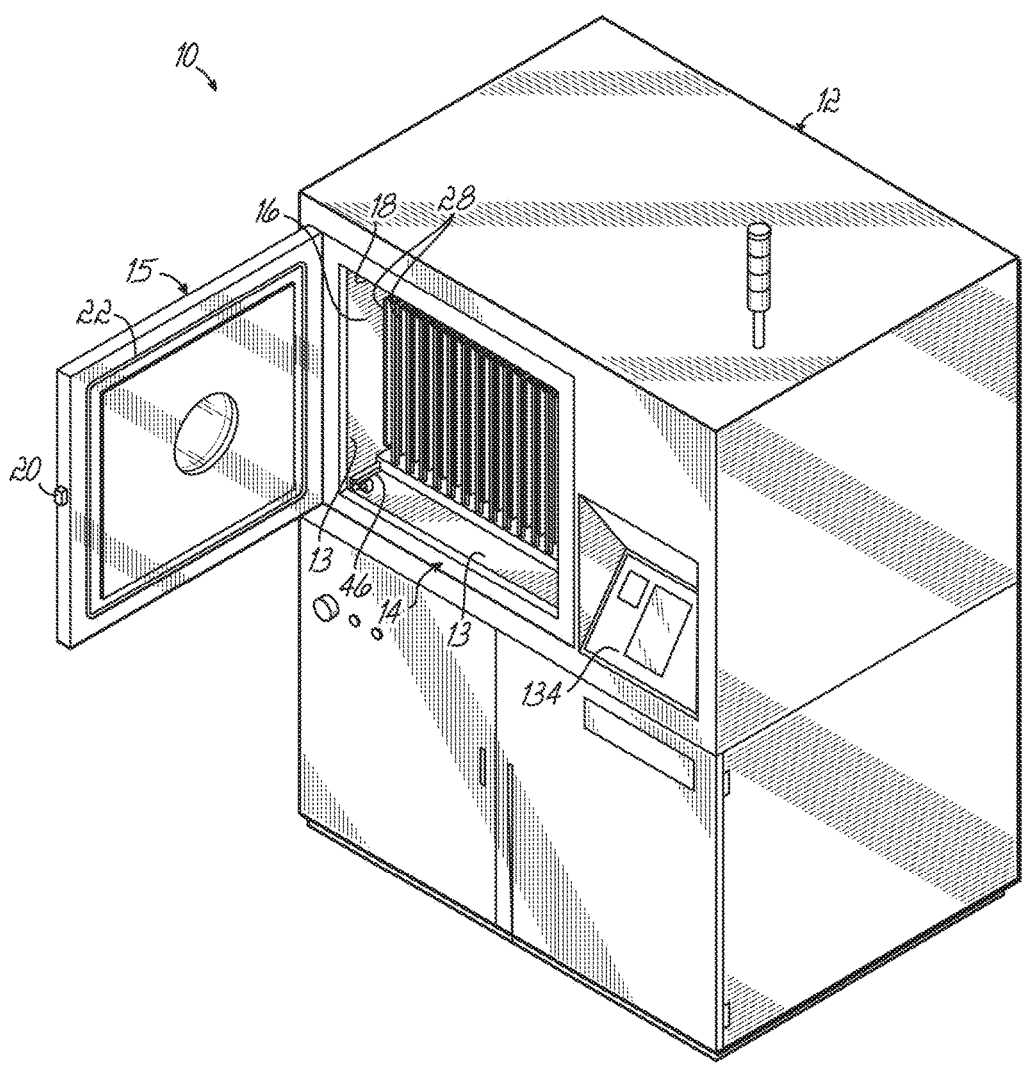
FIG. 1 is a front perspective view of a multiple-electrode plasma treatment system in accordance with an embodiment of the invention.
Figure 2:
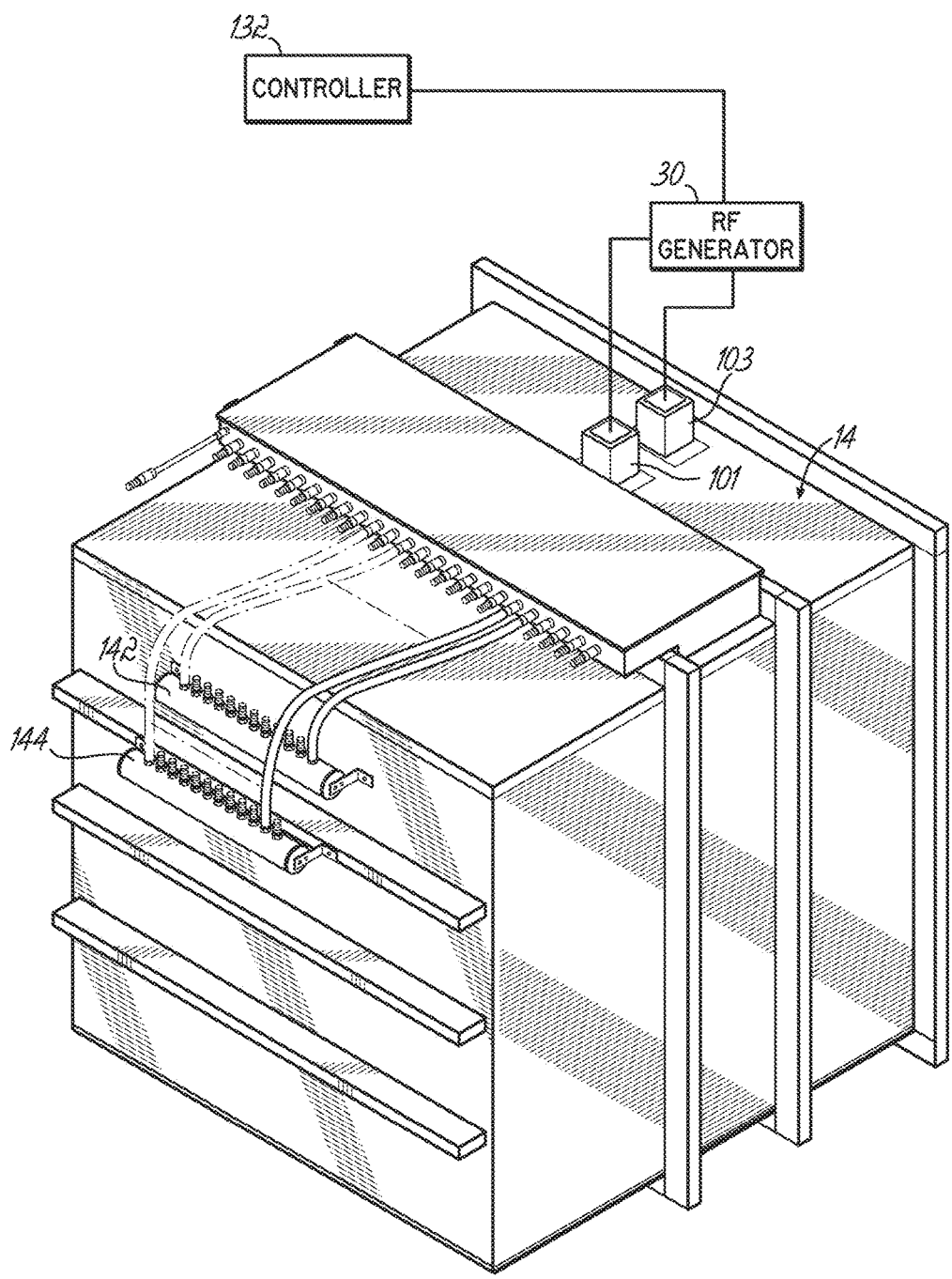
FIG. 2 is a rear perspective view of the vacuum chamber of the plasma treatment system of FIG. 1.
Figure 3A:
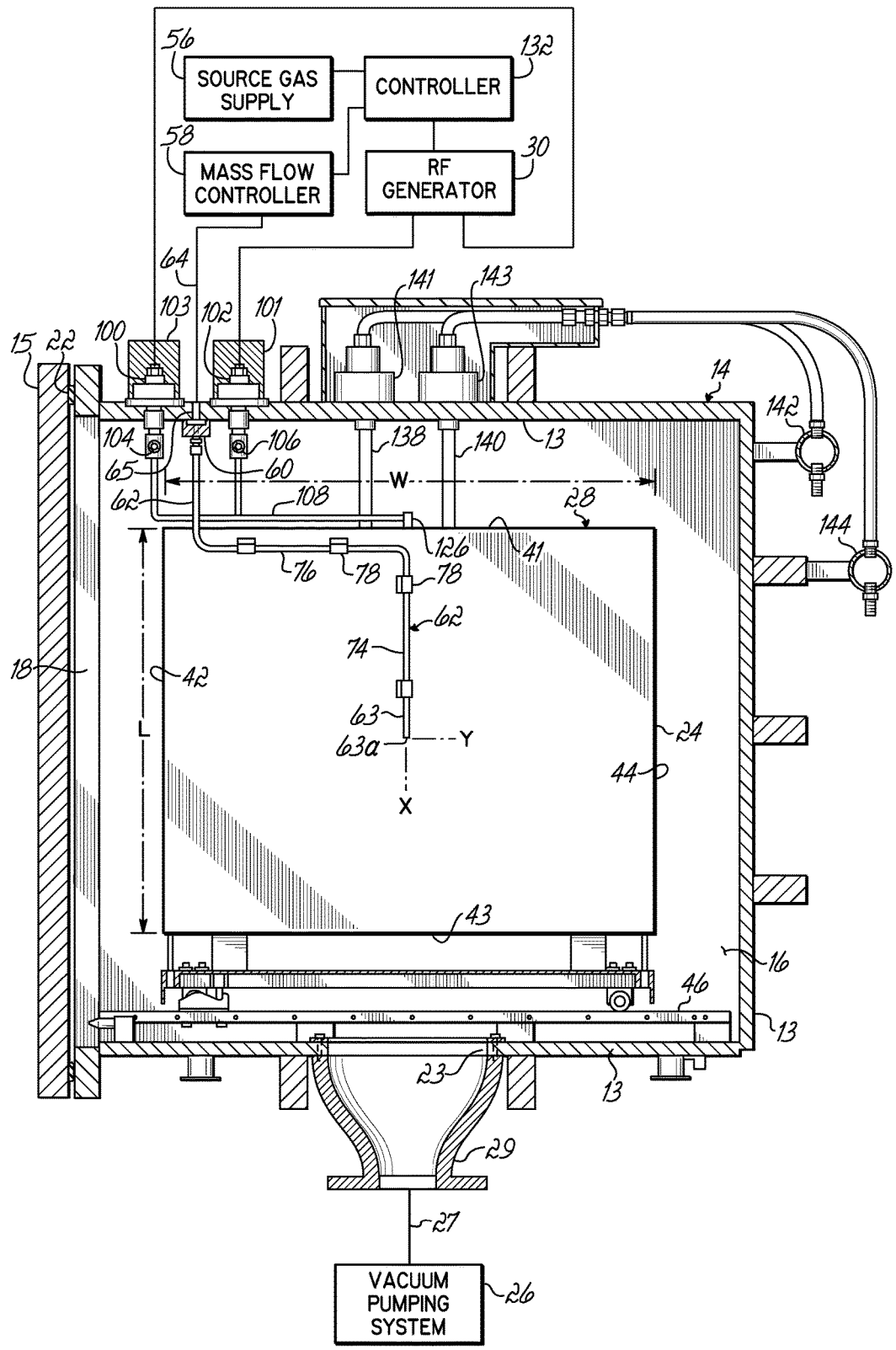
FIG. 3A is a side view of the vacuum chamber of FIG. 2 showing one electrode in an adjacent electrode pair and a gas delivery tube attached to the electrode.
Figure 3B:
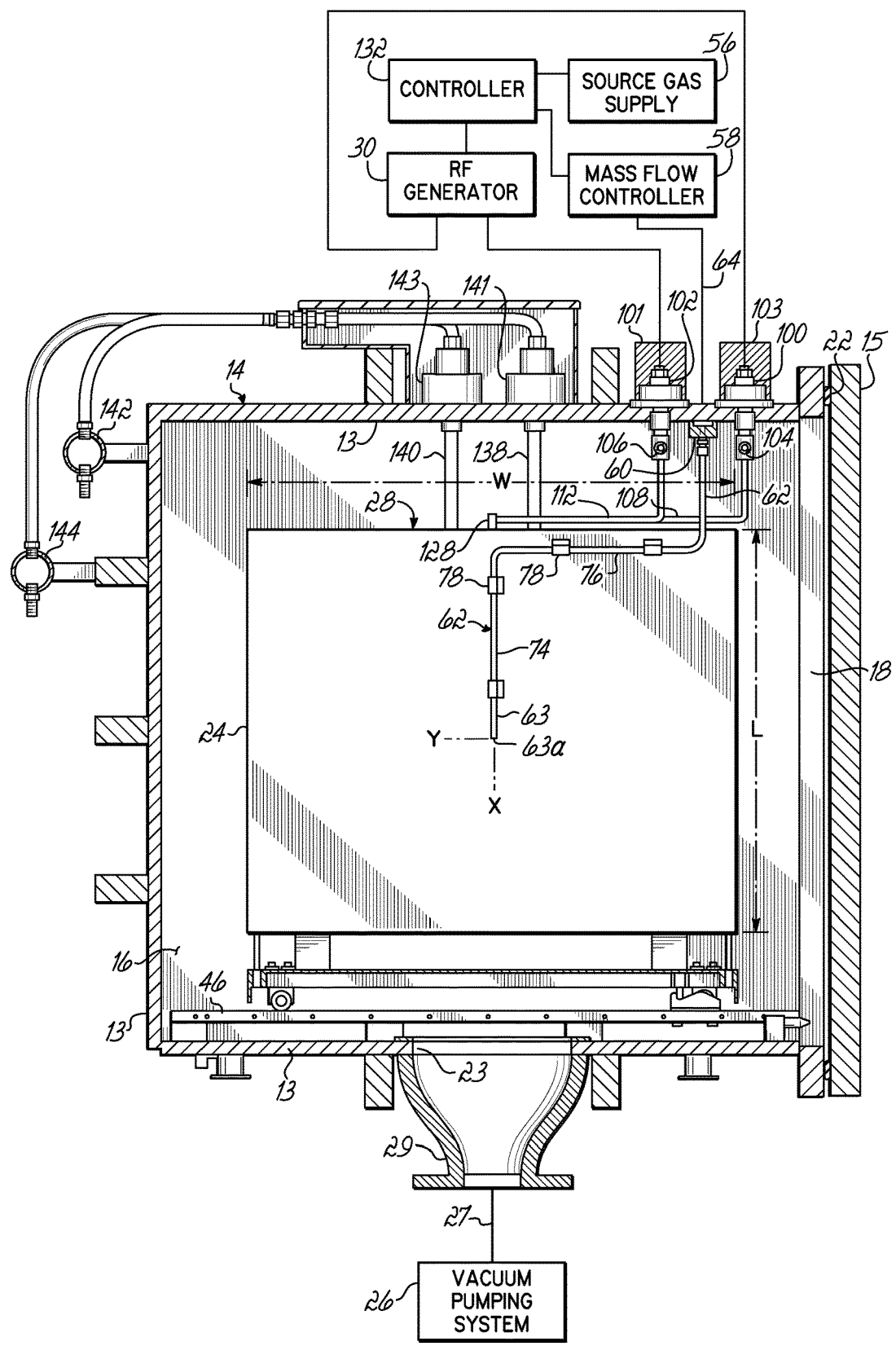
FIG. 3B is a side view similar to FIG. 3A of the other electrode in the adjacent electrode pair and a gas delivery tube attached to the electrode.

With reference to FIGS. 1, 2, 3A, 3B, and 5 in which like reference numerals refer to like features, a plasma treatment system 10 includes a cabinet or enclosure 12, a vacuum chamber 14, and an evacuable space 16 surrounded by sidewalls 13 of the vacuum chamber 14. The evacuable space 16 is accessed through an access opening 18 in the vacuum chamber 14. A chamber door 15 can be opened to reveal access opening 18, through which the evacuable space 16 is accessed, and closed to supply a fluid-tight seal that isolates the evacuable space 16 from the surrounding ambient environment. The chamber door 15, which is attached adjacent to the access opening 18 by hinges positioned along one side edge of the vacuum chamber 14, carries a latch 20 that engages another portion of the vacuum chamber 14 when the chamber door 15 is in the closed position. The latch 20 is used to secure the chamber door 15 in a sealed engagement with the rest of the vacuum chamber 14. A sealing member 22, which encircles the periphery of the chamber door 15, mediates the sealed engagement. The vacuum chamber 14 is formed of an electrically conductive material suitable for high-vacuum applications, such as an aluminum alloy or stainless steel, and is connected with electrical ground.

The evacuable space 16 defined inside the vacuum chamber 14 is evacuated through a pump port 23 penetrating through a bottom wall of the vacuum chamber 14 by a vacuum pumping system 26. The vacuum pumping system 26, which may be located inside the enclosure 12 or on the floorspace adjacent to the enclosure 12, is connected with the pump port 23 by a vacuum line 27, which includes a conical reducer 29 that adjusts for the diameter difference between the pump port 23 and the vacuum line 27. The vacuum pumping system 26 may comprise one or more vacuum pumps having a construction and operation recognized by a person of ordinary skill in the art of vacuum technology. For example, the vacuum pumping system 26 may include a rotary vane pump and roots blower that cooperate to establish and maintain a vacuum pressure within the vacuum chamber 14 that is in the low mTorr range. During processing, the vacuum chamber 14 may be evacuated to, for example, a vacuum pressure in the range of about 200 mTorr to about 300 mTorr. The vacuum pumping system 26 is used to evacuate atmospheric gases from the evacuable space 16 each time that space 16 is vented for a panel exchange.

The plasma treatment system 10 includes a plurality of electrodes 28, which are nominally identical, located inside the vacuum chamber 14 and a plasma excitation source in the representative form of a radio-frequency (RF) generator 30. The electrodes 28 are electrically connected in parallel with the RF generator 30, as described in detail below, and the vacuum chamber 14 serves as an unpowered, grounded counterelectrode. The RF generator 30 includes an impedance matching device and an RF power supply operating at a frequency of, for example, about 40 kHz, although other operating frequencies in the kHz to MHz range may be used. The power supplied to the electrodes 28 may range from about 4000 watts to about 8000 watts at 40 kHz. However, a person having ordinary skill in the art will appreciate that the system 10 may be modified to permit the delivery of different bias powers or, alternatively, may permit the utilization of a direct current (DC) power supply.

The electrodes 28 are suspended from one of the sidewalls 13 of the vacuum chamber 14 with a uniform spacing between the juxtaposed pairs 25 of electrodes 28. An individualized process chamber or cell 52 (FIG. 5) is defined by the space between each adjacent pair 25 of juxtaposed electrodes 28. Each electrode 28, other than the peripherally outermost electrodes 28, participates in two adjacent pair 25 with its nearest-neighbor electrodes 28. Each of the peripherally outermost electrodes 28 only participates in a single adjacent pair 25.

The electrodes 28 have the representative form of solid metal plates that are, for example, about 0.5 inch (about 1.3 centimeter) thick and a rectangular geometrical shape characterized by a length, L, and a width, W. The metal forming electrodes 28, such as aluminum or an aluminum alloy, is characterized by a relatively high electrical conductivity and a relatively high thermal conductivity to promote efficient heat transfer. The electrodes 28 are arranged in a flanking relationship in which adjacent electrodes 28 in each adjacent pair 25 are generally oriented in parallel planes.

Figure 5A:
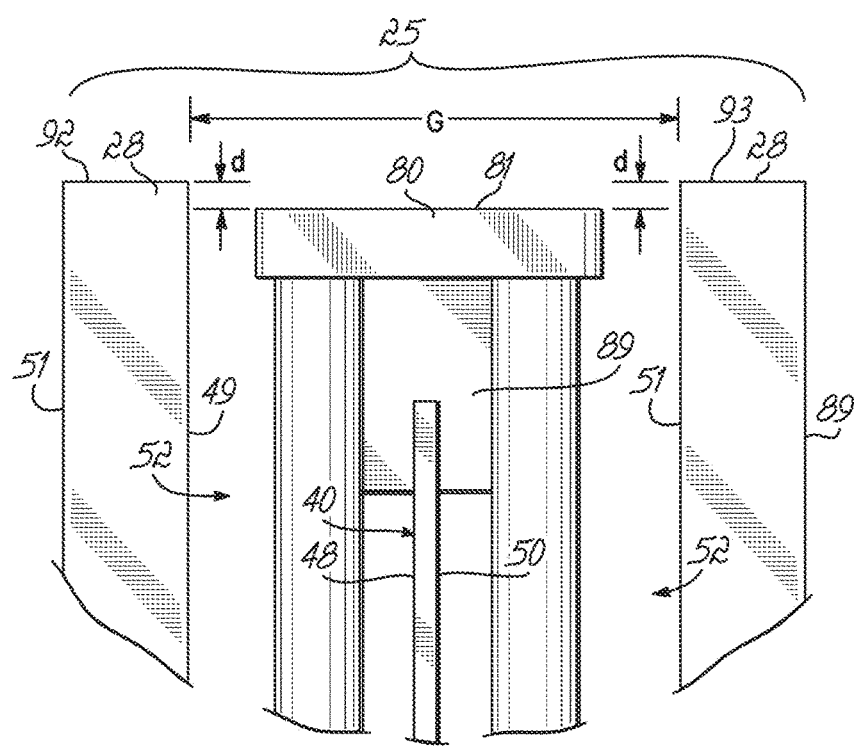
FIG. 5A is an enlarged view of a portion of FIG. 5 with a product visible between the adjacent pair of electrodes and held by the product holder between the adjacent pair of electrodes.
Figure 5:
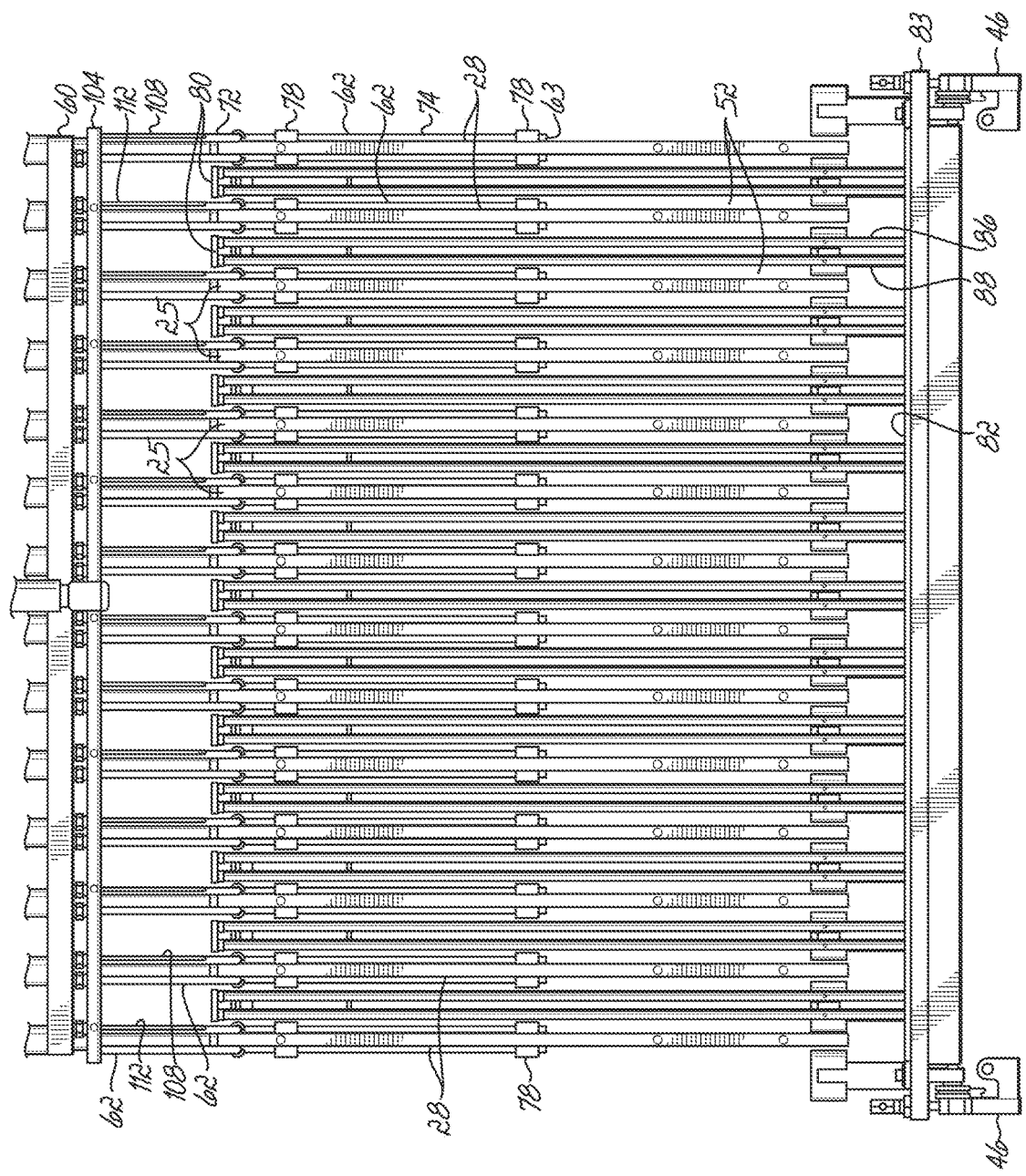
FIG. 5 is an end view of the electrodes and the product holders of the multiple-electrode plasma treatment system in which the products held by the product holders are omitted for clarity of description.
Figure 6:
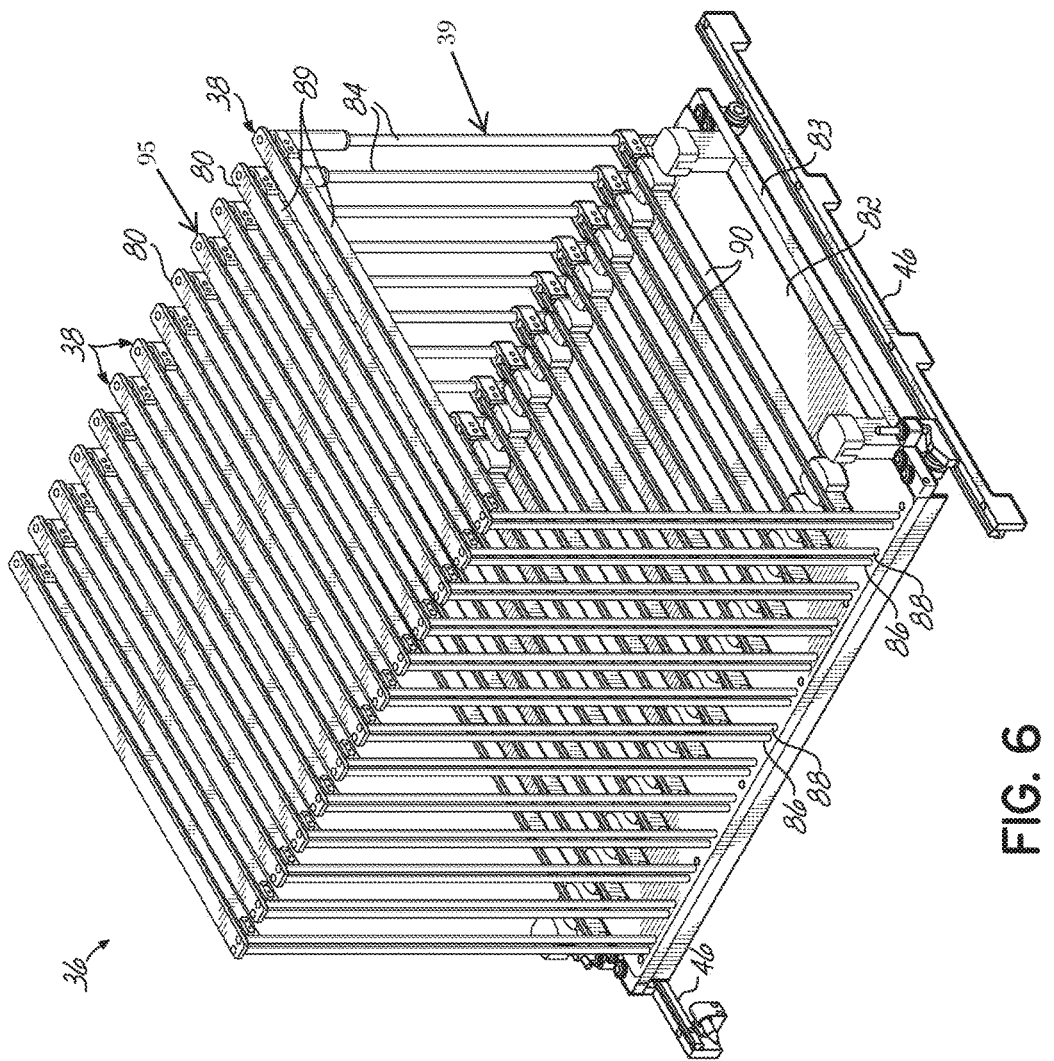
FIG. 6 is a perspective view of the rack of product holders that is used to hold the products at treatment positions in the process chambers inside the multiple-electrode plasma treatment system.

As best shown in FIGS. 5 and 6, the plasma treatment system 10 includes a rack 36 with multiple product holders 38, which are nominally identical, configured support products in representative form of panels 40 inside the vacuum chamber 14. Each of the panels 40 is insertable into one of the product holders 38 in the rack 36. The rack 36 is carried on a cart (not shown) when located outside of the vacuum chamber 14 for ease of movement. After the rack 36 is populated with a lot or batch of panels 40, the chamber door 15 is opened and the rack 36 is transferred from the cart to tracks 46 inside vacuum chamber 14. Following the transfer, the rack 36 is positioned inside the vacuum chamber 14 so the chamber door 15 can be closed to provide a sealed environment ready for evacuation by the vacuum pumping system 26. The rack 36 is mobile while supported on the cart. While the panels 40 in rack 36 are processed in the plasma treatment system 10, another rack (not shown) similar to rack 36 may be loaded with another batch of panels 40 and, when rack 36 is removed after processing, immediately loaded into the vacuum chamber 14 for processing more panels 40.

After loading, one of the panels 40 is disposed in each process cell 52 and, when the plasma treatment system 10 is operating, both opposite surfaces 48, 50 of each panel 40 are plasma treated. While supported by the product holders 38 of rack 36 inside the vacuum chamber 14, the panels 40 are oriented in respective planes generally parallel to respective planes containing the electrodes 28. One surface 48 of the panel 40 confronts a surface 49 of one of the juxtaposed electrodes 28 in each adjacent pair 25. The other surface 50 of the panel 40 confronts a surface 51 of the other of the juxtaposed electrodes 28 in each adjacent pair 25. Each of the electrodes 28 has an outer peripheral edge or perimeter 24 and the outer peripheral edges of panel 40 are disposed inside the outer perimeter 24 of the adjacent pair 25 of electrodes 28. The panels 40 are in an electrically floating state relative to the electrodes 28 and relative to the vacuum chamber 14.

Figure 4:
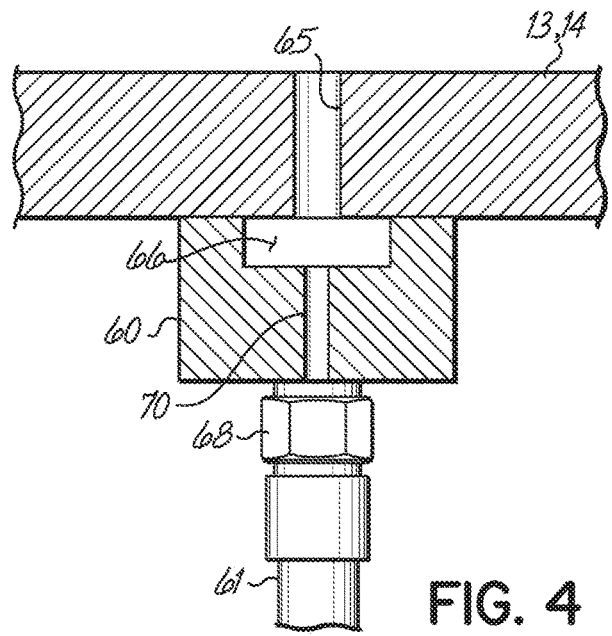
FIG. 4 is an enlarged view of a portion of FIG. 3A showing the gas distribution manifold used to distribute process gas to the gas delivery tubes associated with the different electrodes in the multiple-electrode plasma treatment system.

With reference to FIGS. 3A, 3B, 4, and 5 in which like reference numerals refer to like features, the plasma treatment system 10 includes a source gas delivery system that is configured to deliver source gas to the process cell 52 between each adjacent pair 25 of juxtaposed electrodes 28. The source gas delivery system includes a source gas supply 56, a mass flow controller 58, a gas distribution manifold 60 inside the vacuum chamber 14, and multiple gas delivery tubes 62 also disposed inside the vacuum chamber 14. The source gas supply 56 and mass flow controller 58 are connected by a delivery line 64 with a single gas inlet 65 serving a channel 66 defined by a cavity inside the gas distribution manifold 60, as best shown in FIG. 4. The gas distribution manifold 60 and channel 66 run along the width of the vacuum chamber 14 and an opening (not shown) at one end 61 of each gas delivery tube 62 is connected by a fitting 68 with a corresponding orifice 70 penetrating through the wall of the gas distribution manifold 60 to communicate with the channel 66.

The mass flow controller 58 is used to establish a mass flow rate metering the source gas delivered to the channel 66 of the gas distribution manifold 60. The mass flow controller 58, which has a construction understood by a person having ordinary skill in the art, may be provided with feedback loop control to maintain a selected pressure setting for the source gas or gas mixture flowing in the feed tube that is delivered to the tubular conduits. The stream of source gas from the source gas supply 56 and metered by mass flow controller 58 is delivered at a single inlet to the gas distribution manifold 60 and then distributed by the gas distribution manifold 60 from the channel 66 to the different gas delivery tubes 62. This arrangement permits source gas delivery for all of the process cells 52 to be metered by a single mass flow controller 58.

The flow rate of gas provided by the mass flow controller 58 and the pumping rate of vacuum pumping system 26 are adjusted to provide a vacuum pressure in each process cell 52 that is suitable for plasma generation so that subsequent plasma processing may be sustained. The vacuum chamber 14 is evacuated simultaneously with the introduction of the source gas so that fresh gases are continuously exchanged within the vacuum chamber 14.

In alternative embodiment, multiple gas supplies (not shown) may be connected with the inlet to the gas distribution manifold 60. The mass flow rate of source gas delivered to the gas distribution manifold 60 by each respective additional source gas supply is regulated by a dedicated mass flow controller (not shown). In one specific embodiment, the plasma treatment system 10 may include up to five mass flow controllers and five independent gas supplies. The different sources gas supplies may be used to generate various gas ratios in gas mixtures for use in different process recipes.

With continued reference to FIGS. 3A, 3B, 4, and 5, the gas delivery tubes 62, which are nominally identical, are configured to deliver the source gas to respective process cells 52 at a location generally inside the outer perimeter 24 of the electrodes 28 and between the surfaces 49, 51 of each adjacent pair 25 of electrodes 28. Each of the gas delivery tubes 62 extends between end 61, which has the opening connected by fitting 68 with one of the orifices 70 in the gas distribution manifold 60, and another opening 63a at end 63. Each opening 63a defines an injection port into one of the process cells 52. Each gas delivery tube 62 includes a first tubular section 72 terminating at the opening at end 61, a second tubular section 74 terminating at the opening 63a at end 63, and a third tubular section 76 connecting the first and second tubular sections 72, 74. Each gas delivery tube 62 is bent to form an approximately right angle bend at the intersection of tubular sections 72, 76 and another approximately right angle bend at the intersection of tubular sections 74, 76. As a result, the tubular sections 72, 74, 76 are angled relative to each other.

One of the gas delivery tubes 62 is physically attached by a set of brackets 78 to the surface 49 of each of the electrodes 28. Another of the gas delivery tubes 62 is physically attached by another set of brackets 78 to surface 51 of each of the electrodes 28. As a result, one of the gas delivery tubes 62 is mounted by the brackets 78 to both surfaces 49, 51 of each electrode 28 and two gas delivery tubes 62 attached on two different electrodes 28 deliver source gas to each process cell 52. When one of the panels 40 is positioned between one of the adjacent pairs 25 of electrodes 28, one of the gas delivery tubes 62 on one electrode 28 of the adjacent pair 25 delivers source gas for plasma used to treat one of the surfaces 48, 50 and one of the gas delivery tubes 62 on the other electrode 28 of the adjacent pair 25 delivers source gas for plasma used to treat the other of the surfaces 48, 50. Of course, only one of the gas delivery tubes 62 is attached to the peripherally outermost electrodes 28 in the parallel-plate electrode array.

The opening 63a at the end 63 of each gas delivery tube 62 is physically located at spatial coordinates (x, y) in a plane bounded inside the outer perimeter 24 of the electrode 28. The x-coordinate is specified as a location between opposite lateral edges 42, 44 of the electrode 28 and the y-coordinate is specified as a location between top and bottom edges 41, 43 of the electrode 28. In one embodiment, the opening 63a at the end 63 of each gas delivery tube 62 is located approximately at the geometrical center of the surface 49, 51 to which it is attached. In a specific embodiment, the opening 63a at the end 63 of each gas delivery tube 62 is located with approximately 0.5 inch of the geometrical center of the surface 49, 51 to which it is attached. For the representative rectangular geometrical shape, the opening 63a at end 63 of each gas delivery tube 62 may be located at approximately one half of the length, L, and one half of the width, W, of the respective one of the surfaces 49, 51.

The overall length of each gas delivery tube 62 is intentionally tailored by adjusting the individual lengths of the tubular sections 72, 74, 76 and the inclination of the bends, which is believed to be a factor in establishing an appropriate flow rate of gas to each of the process cells 52 in the plasma treatment system 10. Another factor is believed to be the inner diameter of the conduit bent to form each gas delivery tube 62, as well as the diameter of the orifices 70 in the gas distribution manifold 60. In one embodiment, the overall length of each gas delivery tube 62 is about 21 inches (about 53 centimeters) and the inner diameter of each gas delivery tube 62 is about 0.15 inch (about 0.38 centimeter). The gas delivery tube 62 is unperforated along its length so that the only gas injection point is at opening 63a in end 63. In an alternative embodiment, the gas delivery tube 62 may include multiple gas injection points at different locations along its length.

With reference to FIGS. 5, 5A, and 6 in which like reference numerals refer to like features, the plasma treatment system 10 includes features that retard the escape of the partially ionized source gas of the plasma from the process cells 52. Each product holder 38 of the rack 36 is framed by a horizontal top bar 80, a vertical member in the representative form of a rear rod 84, and vertical members in the representative form of a pair of front rods 86, 88. The rack 36 further includes a bottom plate 82 that is disposed between the product holders 38 and the pump port 23. The rear rod 84, which is located near the rear sidewall 13 of the vacuum chamber 14 when the rack 36 is positioned in the evacuable space 16, connects one end of the top bar 80 with the bottom plate 82. The front rods 86, 88, which are located near the chamber door 15 of the vacuum chamber 14 when the rack 36 is positioned in the evacuable space 16 and the chamber door 15 is closed, connect an opposite end of the top bar 80 with the bottom plate 82.

Upper and lower cross members 89, 90 of each product holder 38 are mechanically connected to the rods 84, 86, 88 and cooperate to support one of the panels 40. At least one of the cross members 89, 90 may be vertically moveable along the rods 84, 86, 88 to adjust the area of the opening framed by the rods 84, 86, 88 and the cross members 89, 90 and, thereby, to accommodate panels 40 of different sizes.

Each top bar 80, each set of rods 84, 86, 88, the bottom plate 82, and each adjacent pair 25 of electrodes 28 collectively bound or surround one of the process cells 52 and, thereby, cooperate to confine the partially ionized source gas of the plasma within each of the process cells 52. Each top bar 80, each set of rods 84, 86, 88, the bottom plate 82, and each adjacent pair 25 of electrodes 28 retards the ability of the partially ionized source gas to escape from one of the process cells 52. Injecting the source gas from each gas delivery tube 62 at an injection point inside the outer perimeter 24 of the electrodes 28 also promotes the confinement with the different process cells 52. The solid nature of the electrodes 28, which prohibits cross-flow of source gas and plasma between the different process cells 52, also cooperates to confine the source gas and plasma and slow escape of the source gas and plasma from the process cells 52. The bottom plate 82, which is also a solid object, operates as a flow diverter that constrains the source gas pumped from the process cells 52 to flow about its outer perimeter 83 in transit to the pump port 23. The reduction in the escape rate is believed to promote increased uniformity of the plasma treatment across the entire surface area of each panel 40 in comparison with the results achieved by conventional processing systems.

The top bar 80, rod 84, and rods 86, 88 associated with each of the product holders 38 defines a frame 39 that includes a flow restricting member 95, and operate as obstructions effective to narrow respective portions of the gap, G, between each adjacent pair 25 of electrodes 28. In one embodiment, each top bar 80 has a width of about 1.75 inches (about 4.4 centimeters) and the separation between surfaces 49, 51 of each adjacent pair of electrodes 28 is about 2 inches (about 5.1 centimeters) so that the gap on each side of the top bar 80 is about 0.125 inch (about 0.32 centimeter).

As best shown in FIG. 5A, a top surface 81 of each top bar 80 is located, lower than the respective top surfaces or edges 92, 93 of the electrodes 28 in each adjacent pair 25 by a distance, d. The top edges 92, 93 form a portion of the perimeter 24 of the electrodes 28 in each adjacent pair 25 and connect the opposite surfaces 49, 51 of each electrode 28. In one embodiment, the top surface 81 of the top bar 80 may be located at least 0.375 inch (at least 0.95 centimeter) from the respective top edges 92, 93 of the adjacent pair 25 of electrodes 28 or lower, which is believed to enhance the gas confinement within the process cell 52. The rear rod 84 is approximately co-planar with the side edges of the adjacent pair 25 of electrodes 28. Similarly, the front rods 86, 88 are in the approximately same plane as the side edges of the adjacent pair 25 of electrodes 28. The rear rod 84 has a greater diameter than the front rods 86, 88.

Figure 7A:
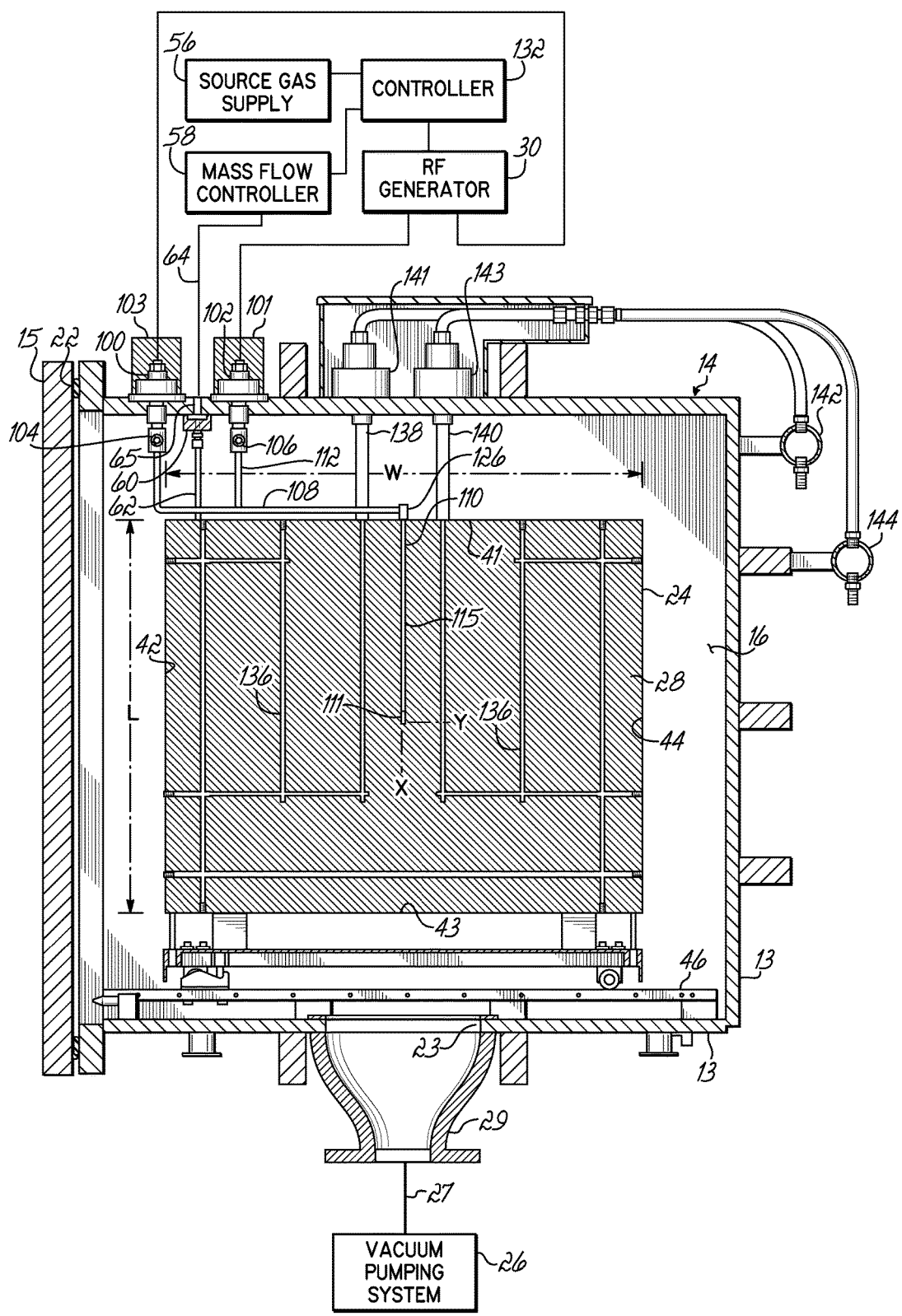
FIG. 7A is a view in partial cross-section of the multiple-electrode plasma treatment system of FIG. 1 in which the conductive members used to power one electrode in an adjacent electrode pair are shown.
Figure 7B:
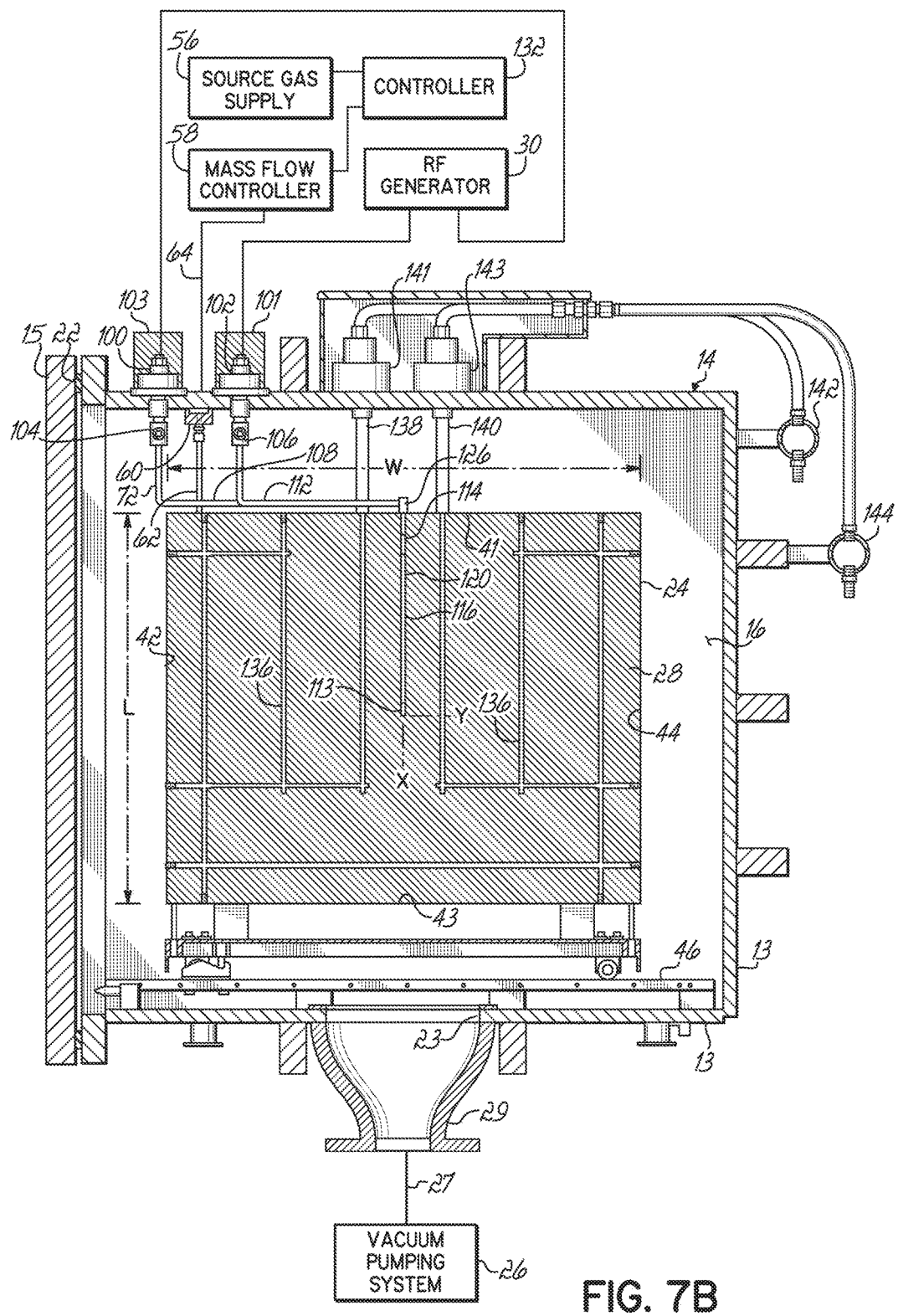
FIG. 7B is a cross-sectional view in partial cross-section similar to FIG. 7A of the in which the conductive members used to power the other electrode in an adjacent electrode pair are shown.
Figure 8:
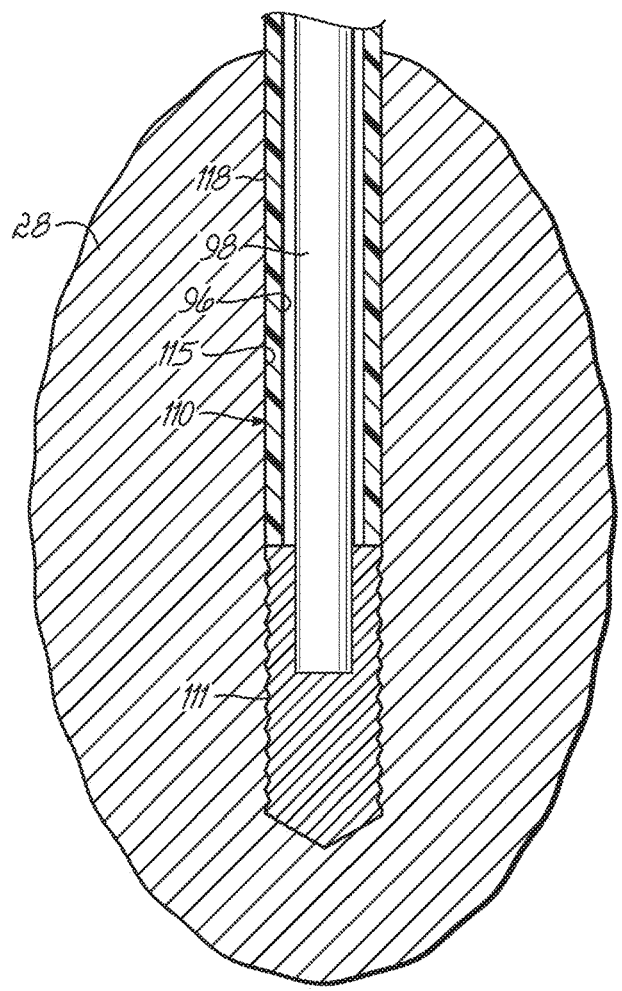
FIG. 8 is an enlarged view of a portion of FIG. 7A showing the details of the conductive member inside the electrode and the electrical and physical connection of the tip of the conductive member to the electrode.
Figure 9:
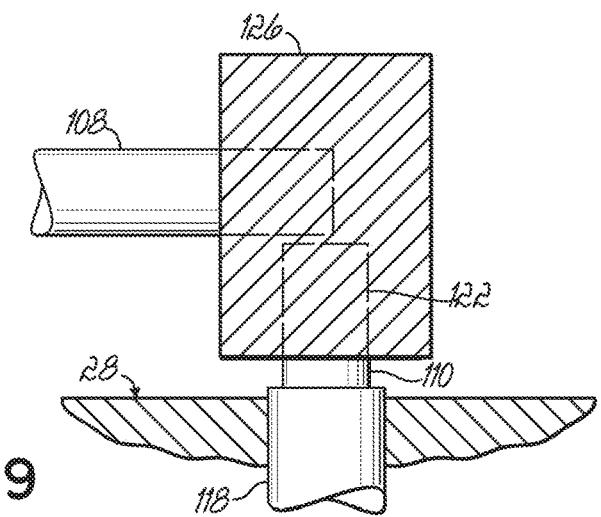
FIG. 9 is an enlarged view of another portion of FIG. 7A showing the details of the conductive member connection at the junction block.

With reference to FIGS. 7A, 7B, and 8 in which like reference numerals refer to like features, the plasma treatment system 10 includes features that cooperate to buss the power from the RF generator 30 to the interior of each of the solid electrodes 28. Power is delivered from the RF generator 30 to a pair of high-voltage electrical feedthroughs 100, 102 that penetrate through one sidewall 13 of the vacuum chamber 14. The high-voltage electrical feedthroughs 100, 102 transfer the RF signals through the sidewall 13 in a vacuum-tight manner. Guard boxes 101, 103 (FIG. 2), which are attached to the exterior of the vacuum chamber 14, operate to shield the exterior connections between the RF generator 30 and the high-voltage electrical feedthroughs 100, 102. In the representative embodiment, the RF power supply of RF generator 30 is a dual output power supply. Alternating electrodes 28 are bussed together and provided power at 180° out of phase with the remaining alternating electrodes 28, which are also bussed together. As a result, the nominal etch rate is similar on the opposite sides of the panel 40 positioned between each adjacent pair 25 of electrodes 28.

A bus bar 104 inside the vacuum chamber 14 is electrically connected with feedthrough 100. Another bus bar 106 inside the vacuum chamber 14 is electrically connected with feedthrough 102. The bus bars 104, 106 extend across the width of the vacuum chamber 14 above the electrodes 28 to facilitate the establishment of electrical connections with the respective sets of alternating electrodes 28. One of the electrodes 28 in each adjacent pair 25 is connected by conductive members 108, 110 with bus bar 104. Conductive members 112, 114 connect the other of the electrodes 28 in each adjacent pair 25 with bus bar 106.

A power bussing channel 115 is formed in one of the electrodes 28 of each adjacent pair 25. Similarly, a power bussing channel 116, is formed in the other electrode 28 of each adjacent pair 25. The channels 115, 116 may be a gun-drilled blind passageways. The power bussing channels 115, 116 are located between the surfaces 49, 51 of the respective electrode 28 and intercept the respective outer perimeter 24. Conductive member 110 is disposed inside the power bussing channel 115 of one of the electrodes 28 in each adjacent pair 25. Similarly, conductive member 114 is disposed in the power bussing channel 116 of the other of the electrodes 28 in each adjacent pair 25. The conductive members 110, 116 and the power bussing channels 115, 116 cooperate to permit interior bussing of the electrodes 28 in each adjacent pair 25.

One peripheral end of conductive member 110 includes a tip 111 that is physically connected by, for example, welding with a region in the power bussing channel 116 to establish a location at which the conductive member 110 is electrically connected with the electrode 28. The location has coordinates (x, y) in a plane bounded by the outer perimeter 24 of the electrode 28. Tip 111 is located approximately at the geometrical center of the electrode 28. For the representative rectangular geometrical shape of electrode 28, the tip 111 is located at (i.e., terminate at) approximately one half of the length, L, and one half of the width, W, of the respective one of the surfaces 49, 51. In one embodiment, the tip 111 is connected to the electrode 28 at a location within 0.5 inch of its geometrical center. Similarly, one peripheral end of conductive member 114 includes a tip 113, which is similar to tip 111, that is physically connected with a region in the power bussing channel 116 to electrically connect the conductive member 114 with the respective electrode 28. In alternative embodiments, the tips 111, 113 may be connected to the respective electrodes 28 with a threaded connections or with set screw based connections.

Conductive member 110 includes a cylindrical core 98 (FIG. 8) formed from a rod-shaped conductor with a relatively high electrical conductivity and a tubular sleeve 118 formed from an insulator characterized by a relatively low electrical conductivity. The tubular sleeve 118 surrounds an outer surface 96 (FIG. 8) of the electrically-conductive core 98. The tubular sleeve 118 electrically isolates the electrical conductor of the conductive member 110 from the electrically-conductive material of the electrode 28 that surrounds the sidewall of the power bussing channel 115. The tip 111 is uncovered by the tubular sleeve 118. As a result, only the tip 111 of the conductive member 110 has an electrical connection with the electrode 28. Conductive member 114, which is similar to conductive member 110, also includes a core (not shown) formed from the conductor and a tubular sleeve 120 similar to tubular sleeve 118 on the outer surface of the core.

Conductive member 110 extends laterally relative to the electrode 28 toward the perimeter 24 and through the power bussing channel 115 to a peripheral end 122 that is opposite to tip 111. The outer surface 96 of conductive member 110 is located longitudinally between tip 111 and peripheral end 122. The peripheral end 122 projects outwardly beyond the outer perimeter 24 of the electrode 28 and is not covered by the tubular sleeve 118. A junction box 126 connects the exposed peripheral end 122 of conductive member 110 with conductive member 108, which provides a conductive path from the bus bar 104 to the conductive member 110. Another junction box 128 connects a peripheral end (not shown) of conductive member 114, which projects out of the power bussing channel 116, with conductive member 112 so as to supply a conductive path from the bus bar 106 to the conductive member 114.

The electrically-insulating material constituting tubular sleeves 118, 120 may be composed of any suitable dielectric material. For example, the tubular sleeves 118, 120 may be composed of a polymeric fluorocarbon material like polytetrafluoroethylene (PTFE), which is the homopolymer of tetrafluoroethylene commercially available under the trade name TEFLON®. Alternatively, the tubular sleeves 118, 120 may be composed of polyethylene terephthalic ester (PETE), which is commercially available under the tradename MYLAR®. In one embodiment, each of the power bussing channels 115, 116 has a diameter of about 0.25 inch (about 0.64 centimeter), the conductive members 108, 110, 112, 114 are composed of aluminum or an aluminum alloy, and the tubular sleeves 118, 120 are constituted by tubes of PTFE that are slipped over the conductive members 110, 114.

The plasma treatment system 10 includes a controller 132 that is embodied in a programmable logic controller (PLC), a digital signal processor (DSP), or another microprocessor-based device with a central processing unit capable of executing software stored in a memory and carrying out the functions described herein, as those functions are understood by those of ordinary skill. The controller 132, which is positioned inside the enclosure 12, is coupled to the various components of the plasma treatment system 10 to facilitate control of the plasma process. A human machine interface (HMI) 134 is operatively connected to the controller 132 in a known manner. The HMI 134 may include output devices, such as alphanumeric displays, a touch screen, and other visual indicators, and input devices and controls, such as a touch-screen interface, an alphanumeric keyboard, a pointing device, keypads, pushbuttons, control knobs, etc., capable of accepting commands or input from the operator and transmitting the entered input to the central processing unit of controller 132. The controller 132 may be provided with standard communications busses compatible with other automated equipment utilized in a production line with the plasma treatment system 10.

Each of the electrodes 28 includes a network of channels 136 used to regulate the temperature of the solid metal plate, which is heated when generating the plasma. Distilled water or another suitable heat-exchange liquid is pumped through the network of channels 136, which may be gun-drilled in the solid metal plates. One of the channels 136 is connected with inlet tubing 138 and another of the channels 136 is connected with outlet tubing 140, which have associated fluid feedthroughs 141, 143 penetrating through a wall of the vacuum chamber 14. The fluid feedthroughs 141, 143 communicate the heat-exchange fluid from the atmospheric-pressure environment into the evacuable space 16 in a sealed manner. The inlet and outlet tubing 138, 140 may supply the mechanical support for suspending the electrodes 28 in the vacuum chamber 14. An inlet distribution tube 142 and an outlet distribution tube 144 on the exterior of the vacuum chamber 14 respectively have taps that are coupled by fitted lengths of tubing with the inlet and outlet tubing 138, 140 serving the channels 136 inside each of the electrodes 28.

The temperature of the electrodes 28 may be regulated by the circulation of the heat-exchange liquid through the respective channels 136. To that end, the heat-exchange liquid may be supplied from a heat exchanger (not shown) to an inlet port of the inlet distribution tube 142 and distributed to each of the inlet tubings 138. The heat exchanger can adjust the flow rate and temperature of the heat-exchange liquid to either heat or cool the electrodes 28, depending on the desired effect. Because heat is transferred during operation between the electrodes 28 and panels 40, the temperature regulation of the electrodes 28 may also be used to beneficially regulate the temperature of the panels 40 during plasma treatment.

In use and with reference to FIGS. 1-8, the product holders 38 of the rack 36 are populated with panels 40 at a location outside of the vacuum chamber 14, the vacuum chamber 14 is vented to atmospheric pressure, the chamber door 15 is opened to reveal the access opening 18, and the rack 36 is transferred through the access opening 18 into the vacuum chamber 14. The access opening 18 is sealed by closing chamber door 15 and engaging the latch 20. Each of panels 40 is supported by one of the product holders 38 between the electrodes 28 of one of the adjacent pairs 25.

Atmospheric gases resident in the evacuable space 16 inside the vacuum chamber 14 are evacuated using vacuum pumping system 26. A flow of a source gas is supplied to the gas distribution manifold 60 from the source gas supply 56 and with a mass flow rate metered by the mass flow controller 58, while actively evacuating the vacuum chamber 14 with vacuum pumping system 26. The source gas is injected into each process cell 52 from the opening 63a at the end 63 of each of the gas delivery tubes 62 serving each adjacent pair 25 of electrodes 28. Each source gas injection point is inside the perimeter 24 of the electrodes 28 and, in one embodiment, is located approximately at the geometrical center or mid-point of the respective one the surfaces 49, 51 of one of the electrodes 28. As a result, one gas injection point is provided between surface 48 of each panel 40 and surface 49 of one of the juxtaposed electrodes 28 in each adjacent pair 25 and another gas injection point is provided between surface 50 of each panel 40 and surface 51 of the other of the juxtaposed electrodes 28 in each adjacent pair 25.

Once a desired process pressure is achieved and stabilized inside the vacuum chamber 14, the RF generator 30 is energized to supply electrical power to the electrodes 28. Electrical power is delivered by conductive members 110, 114 to a location inside each solid electrode 28 in the adjacent pairs 25 that is within the respective perimeter 24 and, in one embodiment, that is approximately at the geometrical center or mid-point of each electrode 28. The source gas resident between each adjacent pair 25 of electrodes 28 is partially ionized by the applied RF energy to generate plasma locally in each of the process cells 52. The plasma inside each of the process cells 52 represents partially ionized source gas consisting of ions, electrons, free radicals, and neutral species. Each top bar 80, each set of rods 84, 86, 88, the bottom plate 82, and each adjacent pair 25 of electrodes 28 surround one of the process cells 52 and cooperate to confine the partially ionized source gas of the plasma within each of the process cells 52 by reducing the escape rate of the partially ionized source gas from the respective process cell 52.

The panels 40 are exposed to the plasma in the process cells 52 for a duration sufficient to treat the exposed opposite surfaces 48, 50 of each panel 40. The ionized gas mixture constituting the plasma is conductive and highly reactive, which promotes the plasma's ability to interact with the panels 40 to perform the prescribed plasma treatment. Plasma-generated active species perform physical processes through ion bombardment and chemical processes through radical/byproduct chemical reactions. Contingent upon the particular source gas or combination of source gases, a different reaction can be caused to occur on the panel surfaces 48, 50. The process recipe may be varied according to the nature of the plasma treatment. For printed circuit board applications, chemical reactions at the surfaces 48, 50 of the panels 40 are utilized to remove drill smear and resist scum and to increase wettability for laminating and legend adhesion. After the treatment is completed, the chamber door 15 is opened to reveal the access opening 18, the rack 36 carrying the processed panels 40 is removed from the vacuum chamber 14, and the processed panels 40 are offloaded from the rack 36 and routed to another processing stage.

References herein to terms such as "vertical", "horizontal", etc. are made by way of example, and not by way of limitation, to establish a frame of reference. It is understood various other frames of reference may be employed without departing from the spirit and scope of the invention. Although the electrodes 28 are referred to as being vertically oriented, a person having ordinary skill in the art will appreciate that the electrodes 28 may have a non-vertical orientation.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept. The scope of the invention itself should only be defined by the appended claims.

We claim:

1. An apparatus for treating products with plasma generated from a source gas, each of the products having a top surface and an opposing bottom surface, the apparatus comprising:

a vacuum chamber including an evacuable space and a pump port communicating with said evacuable space;

a plurality of electrodes in said evacuable space, said electrodes being juxtaposed into a plurality of adjacent pairs, each of said adjacent pairs of said electrodes separated by a gap to define a respective one of a plurality of process chambers, and each of said electrodes having an outer perimeter, a first electrode of each of said plurality of adjacent pairs is configured to be spaced from the top surface of one of the products when the product is located within said gap such that said first electrode confronts the top surface of the product, and a second electrode of each of said plurality of adjacent pairs is configured to be spaced from the bottom surface of the product when the product is located within said gap such that said second electrode confronts the bottom surface of the product, wherein the spacings of the first and second electrodes are such that when the product is located in said gap both the top surface and the bottom surface of the product are positioned to be exposed to the source gas;
a plurality of product holders configured to hold each of the products in a center of the respective one of said plurality of process chambers between said adjacent pairs of said electrodes, each of said product holders including a plurality of cross members configured to support at least one of the products;
a plurality of gas delivery tubes inside said vacuum chamber, each of said gas delivery tubes including an injection port configured to inject the source gas into a respective one of said process chambers, and said injection port being located inside said outer perimeter of each of said adjacent pairs of said electrodes;
a plasma excitation source coupled with said electrodes, said plasma excitation source configured to power said electrodes so as to generate the plasma from the source gas in each of said process chambers;
a plurality of flow restricting members, each of said flow restricting members includes a bar disposed located in a portion of said gap between at least one of said cross members and said outer perimeter of each electrode in said adjacent pairs of said electrodes, said bar having a width narrower than said gap such that each of said flow restricting members operates to constrain a flow of the source gas out of each of said process chambers to said pump port; and
a rack including said plurality of product holders, each of said flow restricting members physically coupled with a respective one of said product holders.

2. The apparatus of claim 1, wherein said rack includes a bottom plate disposed between said product holders and said pump port, the bottom plate being positioned relative to the process chambers so that that the source gas is constrained to flow out of each of said process chambers peripherally about said bottom plate to reach said pump port.

3. The apparatus of claim 2, wherein each of said flow restricting members further includes a plurality of connecting members connecting said bar with the bottom plate.

4. The apparatus of claim 1, further comprising a gas distribution manifold inside said vacuum chamber and connected in fluid communication with said gas delivery tubes.

5. The apparatus of claim 4, wherein said gas distribution manifold includes a channel, each of said gas delivery tubes is coupled in communication with said channel, and the apparatus further comprising:
a mass flow controller configured to regulate a mass flow rate of the source gas to said channel of said gas distribution manifold.

6. The apparatus of claim 5, wherein said electrodes are oriented in a series of parallel planes, and said channel of said gas distribution manifold is aligned approximately perpendicular to said series of parallel planes.

7. The apparatus of claim 1, wherein each of said gas delivery tubes includes a plurality of tubular sections that are angled relative to each other.

8. The apparatus of claim 1, wherein each of said electrodes has a geometrical center inside said outer perimeter, and said injection port of each of said gas delivery tubes is located within one-half of an inch of said geometrical center of said respective one of said electrodes.

9. An apparatus for treating products with plasma generated from a source gas, the apparatus comprising:
a vacuum chamber including an evacuable space and a pump port communicating with said evacuable space;
a plurality of electrodes in said evacuable space, said electrodes being juxtaposed into a plurality of adjacent pairs, each of said adjacent pairs of said electrodes separated by a gap to define a respective one of a plurality of process chambers, and each of said electrodes having an outer perimeter,
wherein one of said electrodes in each of said adjacent pairs has a first surface, another of said electrodes in each of said adjacent pairs has a second surface confronting said first surface, and at least one of the products is located between said first surface and said second surface, and
wherein each of said electrodes includes a channel extending from said outer perimeter into said electrode and a tubular sleeve comprised of an electrical insulator in said channel;
a plurality of gas delivery tubes inside said vacuum chamber, each of said gas delivery tubes including an injection port configured to inject the source gas into a respective one of said process chambers, and said injection port being located inside said outer perimeter of each of said adjacent pairs of said electrodes;
a plasma excitation source coupled with said electrodes, said plasma excitation source configured to power said electrodes so as to generate the plasma from the source gas in each of said process chambers;
a plurality of flow restricting members, each of said flow restricting members located in said gap between a respective one of said adjacent pairs of said electrodes, and each of said flow restricting members operating to constrain a flow of the source gas out of each of said process chambers to said pump port; and
a plurality of conductive members, each of said conductive members disposed within said channel of a respective one of said electrodes, each of said conductive members electrically connected with said respective one of said electrodes at a location inside said outer perimeter of said electrodes to electrically couple said electrode to said plasma excitation source, and each of said conductive members including a tip that projects beyond said tubular sleeve to make electrical contact with one of said electrodes at said location inside said outer perimeter of said electrodes.

10. The apparatus of claim 9, wherein each of said electrodes has a geometrical center inside said outer perimeter, and said location for each of said conductive members is within one-half of an inch of said geometrical center of said respective one of said electrodes.

11. The apparatus of claim 1, wherein the plurality of electrodes are electrically isolated from the plurality of product holders.

12. The apparatus of claim 9, wherein the plurality of electrodes are electrically isolated from the plurality of flow restricting members.

13. An apparatus for treating products with plasma generated from a source gas, each of the products having a top surface and an opposing bottom surface, the apparatus comprising:
a vacuum chamber including an evacuable space and a pump port communicating with said evacuable space;

a plurality of electrodes in said evacuable space, said electrodes being juxtaposed into a plurality of adjacent pairs, each of said adjacent pairs of said electrodes separated by a gap to define a respective one of a plurality of process chambers, and each of said electrodes having an outer perimeter, a first electrode of each of said plurality of adjacent pairs is configured to be spaced from the top surface of one of the products when the product is located within said gap such that said first electrode confronts the top surface of the product, and a second electrode of each of said plurality of adjacent pairs is configured to be spaced from the bottom surface of the product when the product is located within said gap such that said second electrode confronts the bottom surface of the product, wherein the spacings of the first and second electrodes are such that when the product is located in said gap both the top surface and the bottom surface of the product are positioned to be exposed to the source gas;

a plurality of product holders configured to hold each of the products in a center of the respective one of said plurality of process chambers between said adjacent pairs of said electrodes;

a plurality of gas delivery tubes inside said vacuum chamber, each of said gas delivery tubes including an injection port configured to inject the source gas into a respective one of said process chambers, and said injection port being located inside said outer perimeter of each of said adjacent pairs of said electrodes;

a plasma excitation source coupled with said electrodes, said plasma excitation source configured to power said electrodes so as to generate the plasma from the source gas in each of said process chambers;

a plurality of flow restricting members, each of said flow restricting members including a bar and a plurality of connecting members, said bar being located inside said outer perimeter of each electrode in said adjacent pairs, and each of said flow restricting members operating to constrain a flow of the source gas out of each of said process chambers to said pump port; and a rack including said plurality of product holders and a bottom plate, each of said flow restricting members physically coupled with a respective one of said product holders, wherein the plurality of connecting members connect said bar with said bottom plate.

14. The apparatus of claim 13, wherein the bottom plate is positioned relative to the process chambers so that that the source gas is constrained to flow out of each of said process chambers peripherally about said bottom plate to reach said pump port.

15. The apparatus of claim 13, wherein said bar has a width narrower than said gap.

16. The apparatus of claim 13, further comprising a gas distribution manifold inside said vacuum chamber and connected in fluid communication with said gas delivery tubes.

17. The apparatus of claim 16, wherein said gas distribution manifold includes a channel, each of said gas delivery tubes is coupled in communication with said channel, and the apparatus further comprising:

a mass flow controller configured to regulate a mass flow rate of the source gas to said channel of said gas distribution manifold.

18. The apparatus of claim 17, wherein said electrodes are oriented in a series of parallel planes, and said channel of said gas distribution manifold is aligned approximately perpendicular to said series of parallel planes.

19. The apparatus of claim 13, wherein each of said gas delivery tubes includes a plurality of tubular sections that are angled relative to each other.

20. The apparatus of claim 13, wherein each of said electrodes has a geometrical center inside said outer perimeter, and said injection port of each of said gas delivery tubes is located within one-half of an inch of said geometrical center of said respective one of said electrodes.

* * * * *